United States Patent
Yu et al.

(10) Patent No.: US 9,177,621 B2
(45) Date of Patent: Nov. 3, 2015

(54) FAST BIT-LINE PRE-CHARGE SCHEME

(75) Inventors: Hung-Chang Yu, Hsin-Chu (TW); Ku-Feng Lin, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 350 days.

(21) Appl. No.: 13/600,867

(22) Filed: Aug. 31, 2012

(65) Prior Publication Data

US 2014/0064000 A1     Mar. 6, 2014

(51) Int. Cl.
*G11C 7/00*     (2006.01)
*G11C 7/12*     (2006.01)
*G11C 11/4094*  (2006.01)

(52) U.S. Cl.
CPC .............. *G11C 7/12* (2013.01); *G11C 11/4094* (2013.01); *G11C 2207/002* (2013.01); *G11C 2207/005* (2013.01)

(58) Field of Classification Search
CPC ................. G11C 7/12; G11C 11/4094; G11C 2207/002; G11C 2207/005
USPC .......................... 365/102, 154, 203, 205, 207
See application file for complete search history.

(56) References Cited

U.S. PATENT DOCUMENTS 5,525,918 A * 6/1996 Reddy .............................. 327/51
2011/0090745 A1 * 4/2011 La Rosa .................... 365/189.09

* cited by examiner

*Primary Examiner* — Tha-O H Bui
(74) *Attorney, Agent, or Firm* — Slater & Matsil, L.L.P.

(57) ABSTRACT

A device includes a first switch configured to control a connection between a first voltage node and a capacitor, and a second switch configured to control a connection between a common charge node and the capacitor. The device further includes a plurality of bit-lines, and a plurality of bit-line charge switches, each configured to control a connection between a respective one of the plurality of bit-lines and the common charge node.

20 Claims, 1 Drawing Sheet

FAST BIT-LINE PRE-CHARGE SCHEME

BACKGROUND

Memories such as Static Random Access Memories (SRAM) and Dynamic Random Access Memories (DRAM) are widely used in high-speed applications due to their improved performance.

A typical memory array includes word-lines and bit-lines connected to the memory cells in the memory array. The bit lines may include one bit-line or a pair of bit-lines (with often-inversed phases) connected to each column of the memory cells. Before a read operation is started to read the value stored in a memory cell, the respective bit-line is pre-charged, for example, to 0.6V. In the read operation, the voltage on the pre-charged bit-line may be updated in accordance with the value stored in the SRAM cell. By detecting the voltage on the bit-line, the value stored in the memory cell is thus determined.

In a conventional bit-line pre-charge scheme, each of the bit-lines in a memory array is connected to a common charge line through a switch. The common charge line is further connected to a bias voltage that the bit-lines are to be charged to. A charge transistor connects the common charge line to the bias voltage. The charge transistor is typically an NMOS transistor. When a bit-line needs to be pre-charged, the switch of the respective bit-line and the charge transistor are both turned on, so that the bias voltage is connected to the respective bit-line, and the bit-line is pre-charged by the voltage.

When the bit-line capacitance is high, for example, when the respective bit-line is long due to the high number of memory cells connected to this bit-line, the pre-charge may take long time to finish, and hence the operation speed of the memory array is adversely affected. Particularly, the charging speed is increasingly reduced with the proceeding of the pre-charge process. This is caused by the increasing reduction in the gate-to-source voltage of the charge transistor. When the bit-line has been charged to, for example, 80 percent or 90 percent of the target bit-line voltage, the gate-to-source voltage of the charge transistor is reduced to a very low level, and the current flowing through the charge transistor, hence the pre-charging speed, becomes very low. Although a large charge transistor may be used to accelerate the pre-charge process, the required chip area is also increased.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A bit-line pre-charge circuit and the method of pre-charging bit-lines of a memory array are provided in accordance with various exemplary embodiments. In the embodiments, the term "pre-charge" indicates that the respective charge precedes an operation of a respective memory cell, which operation may be a read operation, for example. The variations and the operation of the embodiments are discussed. Throughout the various views and illustrative embodiments, like reference numbers are used to designate like elements.

Figure 1:
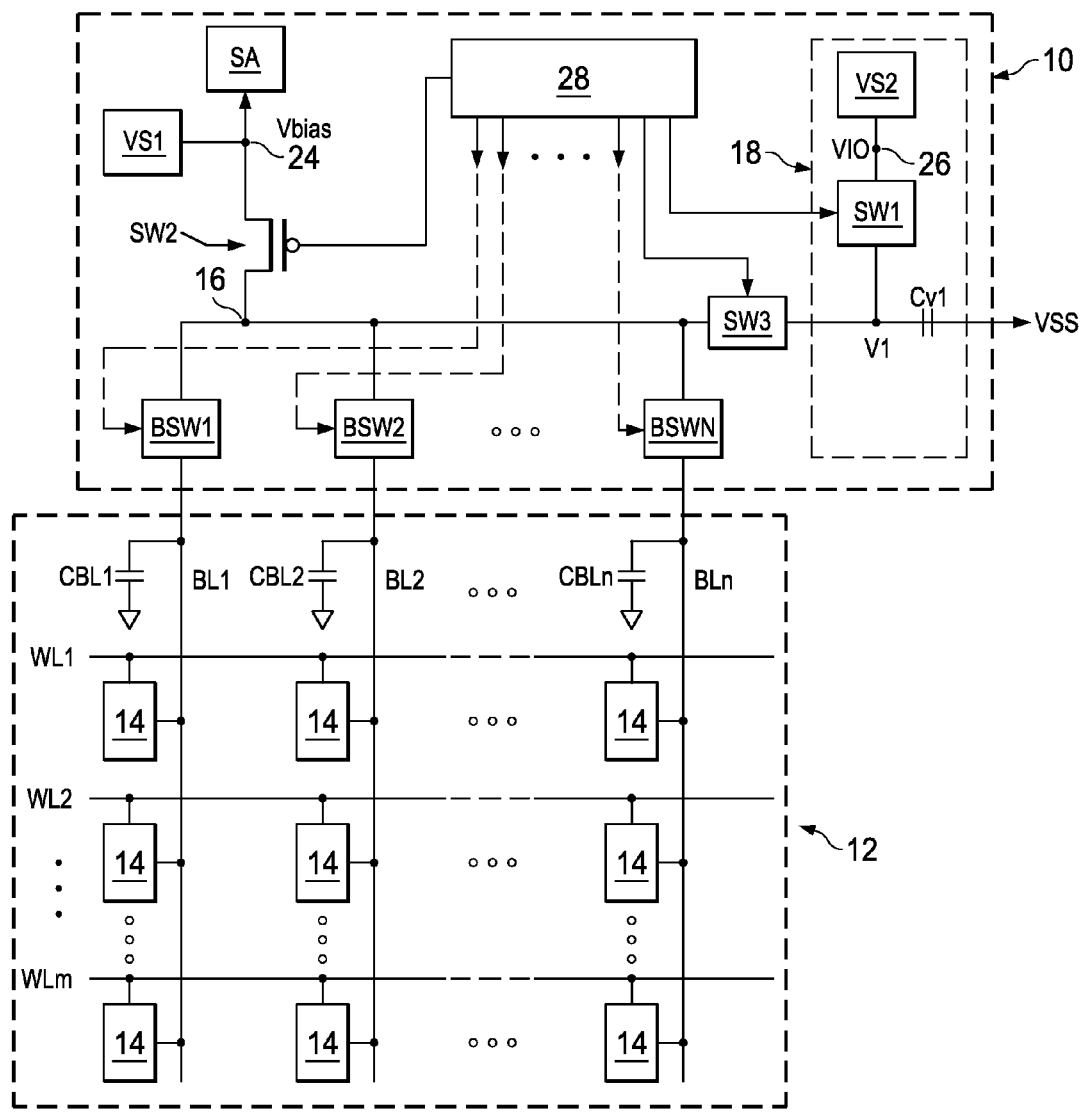
FIG. 1 illustrates a schematic circuit diagram of a bit-line pre-charge circuit in accordance with some exemplary embodiments.

FIG. 1 illustrates a schematic circuit diagram of bit-line pre-charge circuit 10 in accordance with some exemplary embodiments. Bit-line pre-charge circuit 10 is used to pre-charge bit-lines BL1 through BLn of memory array 12. Integer n represents the total number of bit-lines charged by bit-line pre-charge circuit 10. Integer n may be any integer such as 8, 16, 32, etc. Memory array 12 may be a Static Random Access Memory (SRAM) array, a Dynamic Random Access Memories (DRAM) array, or the like, and hence the respective memory cells 14 in memory array 12 may be SRAM cells, DRAM cells, or the like.

Memory array 12 includes a plurality of word-lines WL1 through WLm extending in a first direction, and a plurality of word-lines BL1 through BLn extending in a second direction perpendicular to the first direction. Memory cells 14 are arranged as a plurality of rows and a plurality of columns. Each row of memory cells 14 is connected to one of word-lines WL1 through WLm, and each column of memory cells 14 is connected to one of bit-lines BL1 through BLn. The capacitances of bit-lines BL1 through BLn are represented using capacitors CBL1 through CBLn, which may be parasitic capacitors.

Bit-line pre-charge circuit 10 includes a plurality of bit-line charge switches BSW1 through BSWn, each connecting a respective one of bit-lines BL1 through BLn to common charge node 16. Bit-line charge switches BSW1 through BSWn may be transmission gates, N-type Metal-Oxide-Semiconductor (NMOS) transistors, P-type Metal-Oxide-Semiconductor (PMOS) transistors, or the like. In some embodiments, common charge node 16 is connected to switch SW2, which may be connected to a Sense Amplifier (SA). Switch SW2 may also be a transmission gate, an NMOS transistor, or a PMOS transistor. Furthermore, switch SW2 may be formed of core a device(s) that have thin gate dielectrics. Switch SW2 is configured to control the connection between voltage node 24 and common charge node 16. In some embodiments, voltage source VS1 is connected to voltage node 24, and is configured to generate voltage Vbias, and provide voltage Vbias to voltage node 24.

Bit-line pre-charge circuit 10 further includes charge-storing unit 18, which includes switches SW1 and SW3, and capacitor Cv1 connected to switches SW1 and SW3. Capacitor Cv1 may also be connected between switch SW1/SW3 and a VSS node. Switches SW1 and SW3 may be configured to operate in anti-phases, that is, when switch SW1 is turned on, switch SW3 is turned off, and when switch SW1 is turned off, switch SW3 is turned off, and vice versa. The operation of switches SW2 and SW3 may be operated with a synchronized mode, that is, when switch SW2 is turned on, switch SW3 is turned on, and when switch SW2 is turned off, switch SW3 is turned off, and vice versa. Again, switches SW1 and SW3 may be a transmission gates, NMOS transistors, or PMOS transistors. Switch SW1 is connected to voltage node 26, which has voltage VIO applied thereon. Voltage VIO may be, for example, the power supply voltage of the Input-Output (IO) circuits. Voltage VIO may be provided by voltage source VS2, which is configured to generate voltage VIO. Switch SW3 is connected between, and controls the connection between, common charge node 16 and capacitor Cv1.

Voltage VIO is higher than the target bit-line voltage VBL that bit-lines BL1 through BLn are desirably to be charged to. Voltage VIO may be between about 2 V and about 5 V, for example. Switch SW1 thus may be formed of IO devices that have thick gate dielectric layers. Target bit-line voltage VBL may be between about 0.5 V and about 1.2 V, for example. It is appreciated, however, that the values recited throughout the description are merely examples, and may be changed to different values. In some embodiments, ratio VIO/VBL is greater than about 2, or greater than about 5.

An exemplary pre-charge process is discussed as follows. In an exemplary bit-line pre-charge cycle, one of the bit-lines is to be charged in this pre-charge cycle. In the following discussion, it is assumed that bit-line BL1 is to be pre-charged. In the beginning of the pre-charge cycle, switches SW2 and SW3 are turned off. Switch SW1 is turned on to charge capacitor Cv1 using voltage VIO. Next, switch SW1 is turned off, and switches SW2 and SW3 are turned on. Furthermore, bit-line charge switch BSW1 is turned on in order to pre-charge bit-line BL1, and other bit-line charge switches BSW2 through BSWn are turned off. With switch SW3 being turned on, the charges stored on capacitor Cv1 are shared by capacitors Cv1 and CBL1, and capacitor CBL1 is charged quickly through the charge-sharing. This process may be much faster than charging capacitor CBL1 through switch SW2.

During the pre-charging of bit-line BL1, bias voltage Vbias is applied on node 24. Bias voltage Vbias may be substantially equal to the target pre-charge voltage VBL. In accordance with some embodiments, voltage Vbias is connected to bit-line BL1 to maintain the pre-charged voltage VBL, so that the bit-line voltage does not drop significantly due to leakage currents. Accordingly, switch SW2 may be a very small switch, and the small size of switch SW2 does not affect the pre-charge speed. After the pre-charge process, switches SW2, SW3, and BSW1 are turned off, and switch SW1 is turned on again to re-charge capacitor Cv1. After the pre-charge of bit-line BL1, a read operation may be performed to read the value stored in a memory cell connected to bit-line BL1. The read value is reflected on common charge node 16, and may be sensed and amplified by sense amplifier SA.

The voltage on bit-line BL1 (or any other bit-line that is pre-charged) using the above-discussed pre-charge process is discussed referring to Equations 1 through 3. After the charging of capacitor Cv1 with voltage VIO, the charge amount of the charges stored on capacitor Cv1 is ($Cv1 \times VIO$), assuming the capacitance of capacitor Cv1 is also Cv1. Further assuming bit-line BL1 (and other ones of bit-lines BL1 through BLn) has the capacitance CBL, then since the total charge amount remains unchanged before and after the charge sharing, there is the following equation:

$$Cv1 \times VIO = (Cv1 + CBL) \times VBL'$$ [Eq. 1]

Wherein voltage VBL' is the voltage on the pre-charged bit-line (such as BL1). Accordingly, the resulting voltage VBL' of the pre-charge bit-line BL1 is:

$$VBL' = VIO \times (Cv1/(Cv1 + CBL))$$ [Eq. 2]

By selecting capacitance Cv1 to have an appropriate value, the resulting VBL' may be substantially equal to the target bit-line voltage VBL.

In addition, when the resulting pre-charged voltage VBL' is equal to voltage VBL, Equation 1 may also be rewritten as:

$$Cv1 = CBL \times (VBL/(VIO - VBL))$$ [Eq. 3]

In accordance with some embodiments, voltage VIO may be far greater than target voltage VBL. For example, voltage VIO may be 3.3 V, and voltage VBL may be 0.6V. As a result, voltage difference (VIO−VBL) in Equation 3 is significantly greater than target bit-line voltage VBL. From Equation 3, it is determined that capacitance Cv1 may be significantly smaller than bit-line capacitance CBL. Accordingly, in the embodiments, capacitor Cv1 may be a small capacitor that does not occupy large chip area.

In some embodiments, switches SW1, SW2, SW3, and BSW1 through BSWn are connected to, and controlled by, switch controller 28. Switch controller 28 coordinates the operation of switches SW1, SW2, SW3, and BSW1 through BSWn to perform the pre-charge operation in accordance with embodiments.

Figure 2:
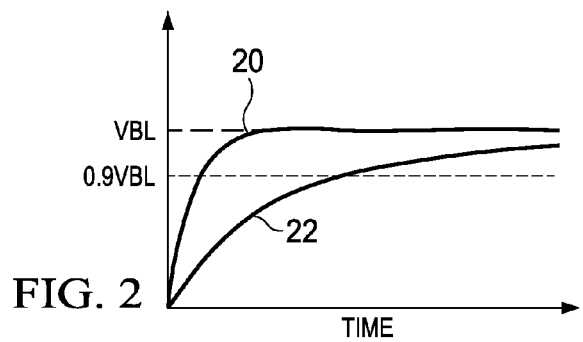
FIG. 2 schematically illustrates the voltages on pre-charged bit-lines as a function of time, wherein the voltage on a bit-line that is pre-charged through charge sharing is compared to the voltage on a bit-line pre-charged through a charge transistor.

FIG. 2 illustrates the voltages on the pre-charged bit-lines as a function of time. Line 20 schematically illustrates the change of the voltage on the charged bit-line over time, wherein line 20 is illustrated in accordance with embodiments, in which the bit-lines are charged through charge sharing. Line 22 schematically illustrates the change of the voltage on the charged bit-line over time, wherein line 22 is illustrated in accordance with conventional bit-line pre-charge schemes, in which the bit-lines are charged through an NMOS transistor. Line 22 shows that in the conventional pre-charge scheme, the charging speed is increasingly reduced over time, especially when the bit-line voltage reaches about 0.9VBL or higher, at which time the gate-to-source voltage of the NMOS transistor is reduced too low due to the increase of the bit-line voltage. Line 20 shows, however, that the charging speed is much faster due to the charge sharing.

In accordance with embodiments, a device includes a first switch configured to control a connection between a first voltage node and a capacitor, and a second switch configured to control a connection between a common charge node and the capacitor. The device further includes a plurality of bit-lines, and a plurality of bit-line charge switches, each configured to control a connection between a respective one of the plurality of bit-lines and the common charge node.

In accordance with other embodiments, a device includes a first voltage node and a second voltage node, a capacitor, and a first switch coupled between the first voltage node and the capacitor. The device further includes a common charge node, a second switch coupled between the common charge node and the capacitor, and a third switch coupled between the second voltage node and the common charge node. The device further includes a memory array including a plurality of bit-lines, and a plurality of bit-line charge switches, each coupled between the common charge node and one of the plurality of bit-lines.

In accordance with yet other embodiments, a method includes charging a capacitor using a first voltage, wherein charges are stored on the capacitor by the step of charging. The charges on the capacitor are shared by the capacitor and a bit-line of a memory array to pre-charge the bit-line.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A device comprising:
   a capacitor;
   a first voltage node;
   a first switch configured to control a connection between the first voltage node and the capacitor;
   a common charge node;
   a second switch configured to control a connection between the common charge node and the capacitor;
   a plurality of bit-lines; and
   a plurality of bit-line charge switches, each configured to control a connection between a respective one of the plurality of bit-lines and the common charge node.

2. The device of claim 1, wherein the first switch and the second switch are configured to operate in anti-phases.

3. The device of claim 1 further comprising:
   a second voltage node;
   a third switch connecting the common charge node to the second voltage node;
   a first voltage source configured to generate a first voltage on the first voltage node; and
   a second voltage source configured to generate a second voltage on the second voltage node, wherein the second voltage is higher than the ground voltage.

4. The device of claim 3, wherein second voltage source is configured to generate the second voltage lower than the first voltage generated by the first voltage source.

5. The device of claim 1 further comprising a switch controller connected to the first switch and the second switch, wherein the switch controller is configured to:
   turn on the first switch and turn off the second switch simultaneously to charge the capacitor with charges; and
   turn off the first switch and turn on the second switch simultaneously to allow the charges to be shared by the capacitor and one of the plurality of bit-lines.

6. The device of claim 1 further comprising a memory array comprising:
   a plurality of memory cells arranged as a plurality of rows and a plurality of columns; and
   a plurality of word-lines, each connected to one row of the plurality of memory cells, wherein the plurality of bit-lines extends in a direction perpendicular to an extending direction of the plurality of word-lines.

7. The device of claim 6, wherein the plurality of memory cells comprises Static Random Access Memory (SRAM) cells.

8. A device comprising:
   a first voltage node and a second voltage node;
   a capacitor;
   a first switch coupled between the first voltage node and the capacitor;
   a common charge node;
   a second switch coupled between the common charge node and the capacitor;
   a third switch coupled between the second voltage node and the common charge node;
   a memory array comprising a plurality of bit-lines; and
   a plurality of bit-line charge switches, each coupled between the common charge node and one of the plurality of bit-lines.

9. The device of claim 8, wherein the first switch and the second switch are configured to operate in anti-phases, and wherein the second switch and the third switch are configured to be operated in a synchronized mode.

10. The device of claim 8 further comprising a switch controller connected to, and configured to control operations of, the first, the second, and the third switches.

11. The device of claim 10, wherein the switch controller is further connected to the plurality of bit-line charge switches, and wherein the switch controller is configured to, when turning on the second switch, turning on one of the plurality of bit-line charge switches.

12. The device of claim 8 further comprising:
   a first voltage source connected to, and configured to generate a first voltage on, the first voltage node; and
   a second voltage source connected to, and configured to generate a second voltage on, the second voltage node, wherein the second voltage is a non-ground voltage lower than the first voltage.

13. The device of claim 12, wherein the first voltage is a power supply voltage of an Input-Output (IO) circuit.

14. The device of claim 8 further comprising a sense amplifier electrically coupled to the common charge node, wherein the sense amplifier is configured to sense a voltage on the common charge node.

15. A method comprising:
   charging a capacitor using a first voltage, wherein charges are stored on the capacitor by the step of charging; and
   sharing the charges on the capacitor by the capacitor and a bit-line of a memory array to pre-charge the bit-line.

16. The method of claim 15 further comprising, when the step of sharing the charges is performed, connecting the bit-line to a second voltage through a switch.

17. The method of claim 16, wherein the second voltage is lower than the first voltage, and wherein the second voltage is close to a voltage on the bit-line at a time after the charges are shared by the capacitor and the bit-line and before the step of sharing.

18. The method of claim 15, wherein the memory array further comprises a plurality of bit-lines, and wherein the method further comprises, at a time the step of charging the capacitor is performed, disconnecting the plurality of bit-lines from the capacitor.

19. The method of claim 15, wherein the step of sharing comprises:
   turning on a first switch, wherein the first switch connects the capacitor to the first voltage; and
   turning off a second switch, wherein the second switch is coupled between the capacitor and the bit-line, and wherein the step of sharing comprises:
   turning off the first switch; and
   turning on the second switch.

20. The method of claim 15 further comprising, after the step of sharing the charges, reading a memory cell that is connected to the bit-line.

* * * * *